(12) United States Patent
Bash et al.

(10) Patent No.: US 7,068,509 B2
(45) Date of Patent: Jun. 27, 2006

(54) SMALL FORM FACTOR COOLING SYSTEM

(75) Inventors: Cullen E. Bash, San Francisco, CA (US); Glenn C. Simon, Auburn, CA (US); Christopher G. Malone, Loomis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/772,115

(22) Filed: Feb. 3, 2004

(65) Prior Publication Data

US 2005/0168938 A1  Aug. 4, 2005

(51) Int. Cl.
*H05K 7/20* (2006.01)

(52) U.S. Cl. ............... 361/700; 361/687; 165/80.3; 165/104.33

(58) Field of Classification Search ........ 361/687–703, 361/724; 454/184; 165/80.3, 80.4, 80.5; 312/236
See application file for complete search history.

(56) References Cited

U.S. PATENT DOCUMENTS

| | | | | |
|---|---|---|---|---|
| 5,528,454 | A * | 6/1996 | Niklos | 361/695 |
| 6,313,990 | B1 * | 11/2001 | Cheon | 361/699 |
| 6,477,055 | B1 | 11/2002 | Bolognia et al. | |
| 6,574,100 | B1 | 6/2003 | Anderson | |
| 6,583,989 | B1 | 6/2003 | Guyer et al. | |
| 6,657,121 | B1 * | 12/2003 | Garner | 174/16.3 |
| 6,776,221 | B1 * | 8/2004 | Montgomery et al. | 165/46 |
| 2004/0107718 | A1 * | 6/2004 | Bowman et al. | 62/259.2 |

OTHER PUBLICATIONS

Web Site: www.intel.com/design/servers/SR1350-E/SR1350e_brief.pdf, printed on Dec. 3, 2003, publication date unknown.
Pal, Aniruddha, et al., "Design and Performance Evaluation of a Compact Thermosyphon", Therms 2002 Conference (May 2002).
Joshi, Yogendra, "heat out of small packages", Mechanical Engineer Journal (Dec. 2001).
Pal, Aniruddha, et al., "Design and Performance Evaluation of a Compact Thermosyphon", IEEE Transactions on Components and Packaging Technologies, vol. 25, No. 4 (Dec. 2002).
Nietelmal, Monem, "Two-Phase Loop: Compact Thermosyphon", HP Labs Research Library (Jan. 11, 2002).

* cited by examiner

*Primary Examiner*—Lynn Feild
*Assistant Examiner*—Anthony Q. Edwards
(74) *Attorney, Agent, or Firm*—Richard P. Lange

(57) ABSTRACT

An enclosure forms a plurality of tiers vertically stacked in a longitudinal dimension. Each tier is a 1U modular computer system having a computer chassis configured for mounting in the multi-tiered support, and computer components that need cooling within the computer chassis. An evaporator is in thermal communication with at least one of the computer components, and vaporizes a coolant to cool that component. A condenser dissipates heat from the coolant vapor, and provides liquid coolant back to the evaporator. The condenser directs liquid coolant gravitationally downward, making the condenser and evaporator gravity driven. An air mover within the chassis cools the condenser, blows air across other components needing cooling, and removes heated air from the chassis.

20 Claims, 3 Drawing Sheets

SMALL FORM FACTOR COOLING SYSTEM

The present invention relates generally to multi-tiered, modular rack systems for components and, more particularly, to a cooling system for cooling components in a small form factor chassis mounted in a standardized system rack.

BACKGROUND OF THE INVENTION

Multi-tiered, modular racks are commonly used with groups of modular chassis. Such racks commonly provide each chassis with access to network connections and electrical power. A typical chassis might contain components and interconnecting devices (e.g., printed circuit board cards and wires) that form a computer system such as a server. Each chassis functions to provide an environment relatively free from excessive heat, shock, vibration and/or dust for the computer system. Groups of these computer systems are interconnected to form electronic applications, such as server farms that serve the networking needs of large organizations.

In present-day, standardized racks, 1U "pizza-box" chassis (being approximately 1.7 inches tall, and various lateral sizes such as 19 by 24 inches), each housing a separate computer having one or more CPUs, are found to be useful. In particular, the small form factor (i.e., size) allows for a large number of computers to be vertically stacked, with up to around 40U or 42U, in each rack. The modular nature of each such chassis allows for a given computer system to be swapped out of the network and the rack without interfering with the operation of other computer systems.

Each chassis typically has one or more air movers (e.g., fans) that pump ambient air through the chassis to absorb heat from the components, or from heat sinks attached to the components. In response to demands for networks of high-performance computer systems, components are being designed with increased cooling requirements, and printed circuit boards are being designed with increased component densities. Managing these increased heat dissipation requirements is complicated by the limited size of the 1U chassis. In particular, the small form factor limits both the available fan sizes and the space for air to flow through the chassis. The limited space typically includes many impediments, such as heat sinks, wires and components, causing significant airflow impedance. As a result, the airflow through the chassis can be significantly limited, thereby limiting the dissipation ability of the chassis cooling system. Furthermore, the tight space configuration can create cooling issues such as hot spots, dead zones and/or insufficient cooling capacity in particular chassis locations.

It will therefore be appreciated that there is a need for a cooling system and apparatus for effectively cooling the heat-dissipating components housed within a 1U chassis in multi-tiered, modular racks. There is also a need for a resulting modular rack system. Preferred embodiments of the present invention satisfy some or all of these needs, and provide further related advantages.

SUMMARY OF THE INVENTION

In various embodiments, the present invention may solve some or all of the needs identified above, providing a rack-mounted 1U chassis having a cooling system configured to cool components. More particularly, the invention provides a modular computer system for mounting in a multi-tiered support. The computer system includes a computer chassis configured for mounting in the multi-tiered support, and one or more computer components within the computer chassis.

To cool the one or more components, the computer system includes an evaporator, a condenser and an air mover. The evaporator is in thermal communication with the one or more computer components, and is configured to dissipate heat from the one or more components by using the heat to evaporate liquid coolant from a stream of liquid coolant to produce a stream of coolant vapor. The condenser is in turn configured to dissipate heat from the stream of coolant vapor to add liquid coolant to the stream of liquid coolant. The air mover is configured to cool the condenser.

As described below, embodiments of the invention can include additional features that will provide various advantages in some configurations. In particular, the computer system may feature a thin, 1U or 2U chassis. The computer may also feature a gravity-driven, closed-loop cooling system, which may or may not be augmented by a coolant pump. The air mover may extend across an intermediate portion of the chassis, and be configured to draw air through the condenser, while blowing air onto other components and out chassis exhaust vents. Various aspects of these features can often provide for efficient use of space and power, as well as providing reliability benefits, while being usable with computer systems conforming to typical industry server configurations.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather, it is intended to provide particular examples of them.

Typical embodiments of the present invention reside in a tiered apparatus for supporting, cooling, and connecting or interconnecting a plurality of thin, stackable computer chassis. The tiered apparatus is typically in the form of a multi-tiered modular rack, which can optionally be configured with wiring such that the computer chassis receive power, and interconnect to form networked computer systems or other electronic devices.

Figure 1:
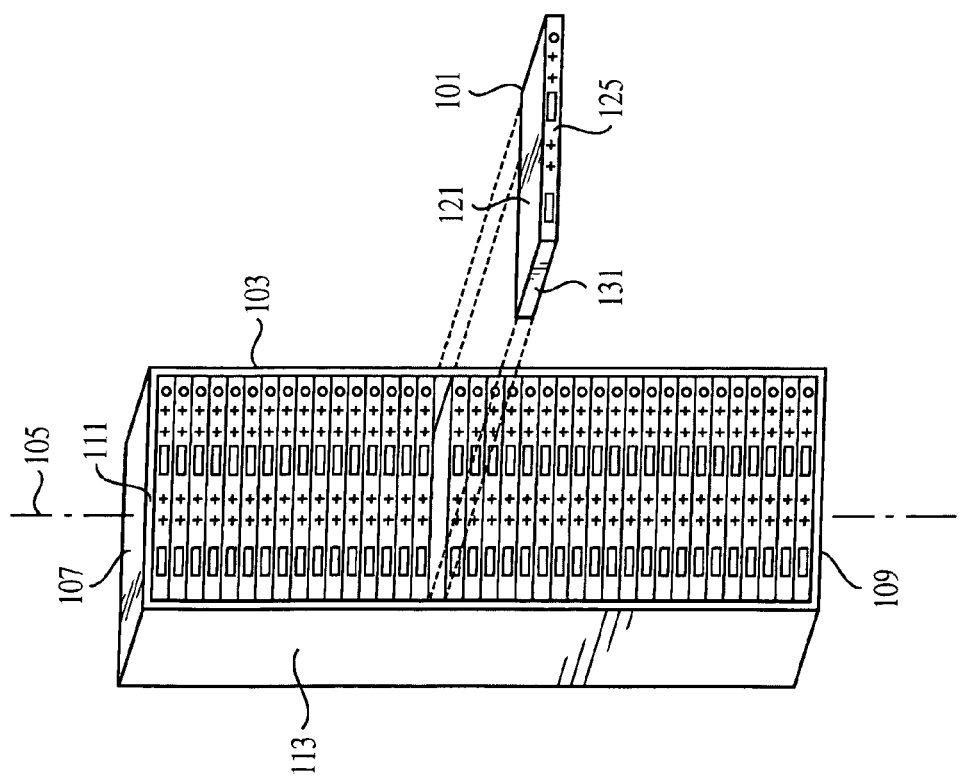
FIG. 1 is a perspective view of a multi-tiered modular rack, with a removed modular chassis, embodying the invention.
Figure 3:
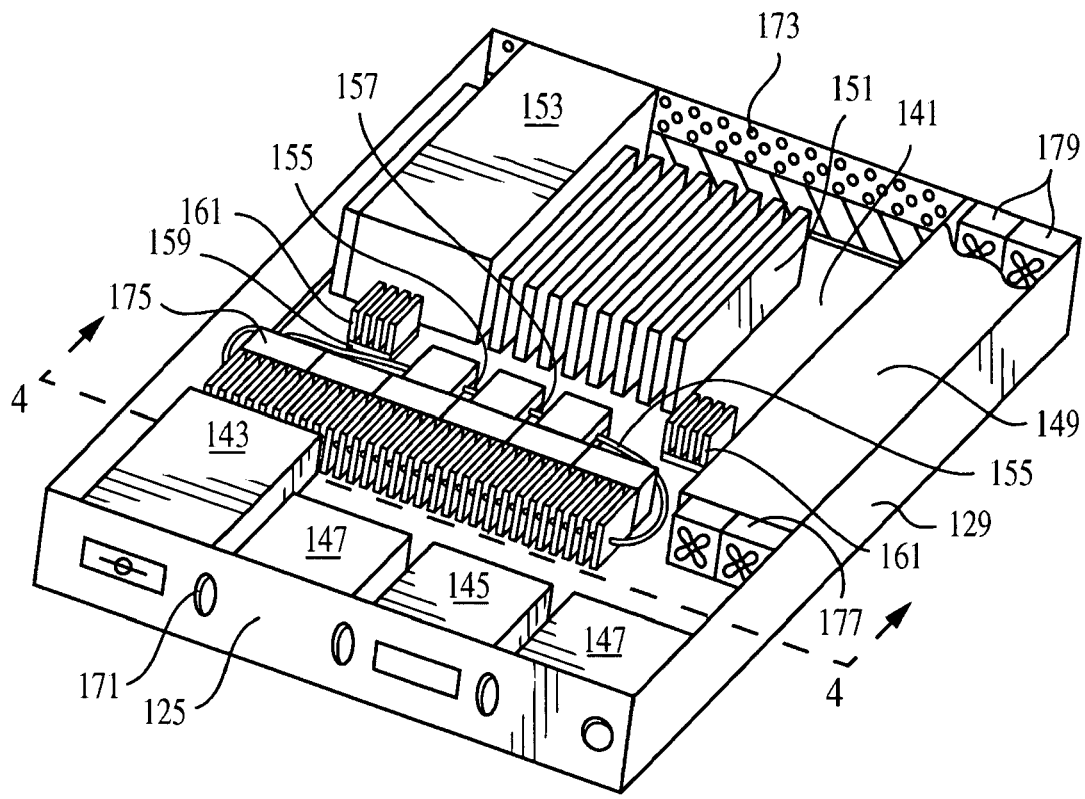
FIG. 3 is a perspective, cutaway view of the removed chassis depicted in FIG. 1.

With reference to FIG. 1, a first embodiment of the present invention is an apparatus forming a tiered structure. More particularly, the embodiment includes a multi-tiered support that is configured to hold a plurality of computer chassis 101. Preferably the multi-tiered support is a conventional modular rack 103 configured for a plurality of 1U servers.

The chassis 101 are stacked in a tier-stacking dimension, which will be referred to as a longitudinal dimension 105. The longitudinal dimension extends between two ends of the stack, a top end 107 and a bottom end 109. In addition to the top and bottom ends, the tiered structure includes four lateral sides: a front side 111 and opposite rear side, and a left side 113 and opposite right side.

With reference to FIGS. 1–5, similar to the modular rack 103, each chassis 101 has opposite longitudinal ends, a top end 121 and a bottom end 123, along (and with respect to) the longitudinal dimension 105. Each chassis also has a front side 125, a rear side 127, a right side 129 and a left side 131, each chassis side and end corresponding to the similarly named sides and ends of the modular rack when the chassis is mounted in the rack. Preferably each chassis is a thin chassis (i.e., thin along the longitudinal dimension 105), typically being a 1U rackmount chassis (i.e., being 1U in height and configured to fit in a standard rack), or alternatively ranging in size up to 2U in height.

Each chassis 101 is configured with a bottom panel 141 to support and/or interconnect one or more electronic assemblies, including a floppy drive 143, a CD and/or DVD drive 145, a plurality of hard disk drives 147, a power supply 149, memory cards 151, input/output ("I/O") units 153, a plurality of central processor units ("CPUs") 155 having high heat dissipation requirements, other high-dissipation components 157, and some moderate heat dissipation components 159 (i.e., having moderate heat dissipation requirements), which may be fitted with heat sinks 161. The power supply adjoins the right and rear sides of the chassis 101. The bottom panel is preferably a printed circuit board wired to interconnect the electronic assemblies to form a computer configured for use as a network server, an application-specific thin server, or the like.

The chassis and modular rack are configured to provide an environment relatively free from excessive shock, vibration and/or dust. In particular, the chassis bottom panel 141, front side 125, rear side 127, right side 129 and left side 131 form five sides of a controlled chassis chamber containing the electronic assemblies. The sixth side may be formed by an additional chassis panel, a panel in the modular rack, or by a bottom panel of a neighboring chassis contiguous with the top end 121 of the chassis 101.

Figure 2:
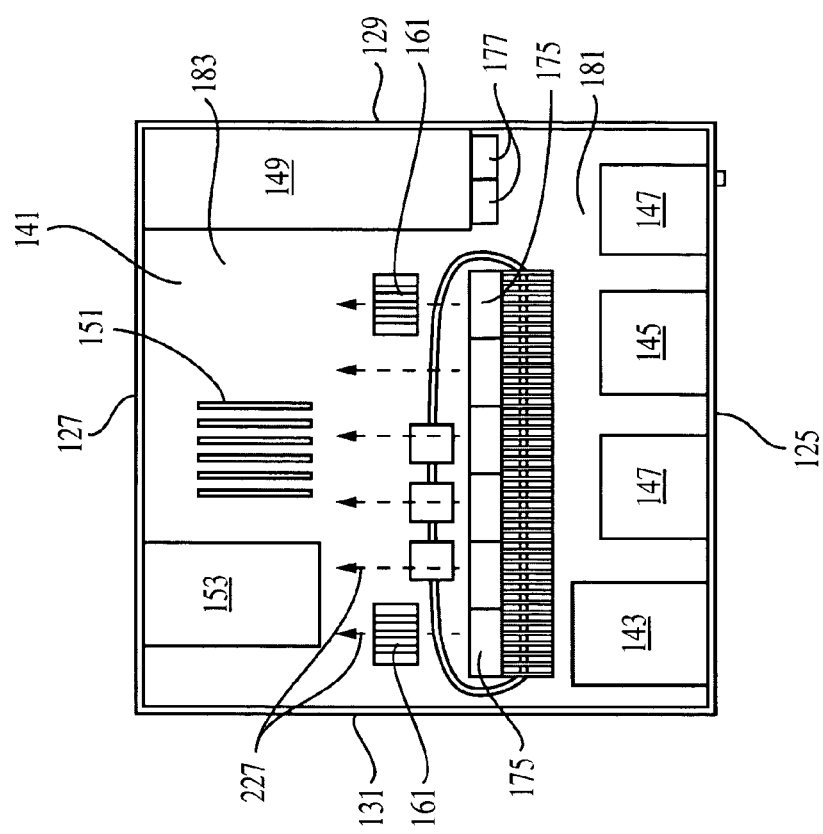
FIG. 2 is a top view of the removed chassis depicted in FIG. 1.

The chassis and its electronic assemblies are also configured with a cooling system to dissipate heat from the electronic assemblies requiring heat dissipation. More particularly, the chassis front side 125 defines intake air vents 171, and the chassis rear side 127 defines exhaust air vents 173. An air mover including a bank of chamber fans 175 extends laterally across the chassis chamber between the chassis left side 131 and the power supply 149. Additionally, the power supply 149 has dedicated intake fans 177 and exhaust fans 179. The power supply intake fans are roughly aligned (laterally) with the bank of chamber fans (as seen in FIG. 2). All of the fans, including the chamber fans, the power supply intake fans and the power supply exhaust fans, blow in a rearward direction.

The power supply is fully enclosed such that the dedicated intake fans 177 and exhaust fans 179 control and direct all the cooling airflow entering and exiting the power supply. The intake fans 177 draw air from within the chassis chamber, and the exhaust fans 179 blow air from within the power supply directly through vents in the rear side 127 of the chassis, thus preventing the hot air from the power supply from reaching other portions of the chassis.

The bank of chamber fans 175 and the power supply divide the chassis chamber such that, excluding the power supply, the chassis chamber forms two chambers, an upstream chamber 181 and a downstream chamber 183. The bank of chamber fans 175 draws air from the upstream chamber and blows it into the downstream chamber, thereby lowering the air pressure in the upstream chamber and raising the air pressure in the downstream chamber.

The lower pressure in the upstream chamber draws in outside, ambient air, particularly through the intake air vents 171, and possibly through the floppy drive 143, the CD and/or DVD drive 145, and the plurality of hard disk drives 147. This outside air can provide some heat dissipation to the floppy drive 143, the CD and/or DVD drive 145, and the plurality of hard disk drives 147. While some air may flow backward from the downstream chamber to the upstream chamber, the higher pressure in the downstream chamber forces much of the air in the downstream chamber to be exhausted out the exhaust air vents 173, thus transferring the heat removed from the vapor to a location outside of the chassis.

Figure 4:
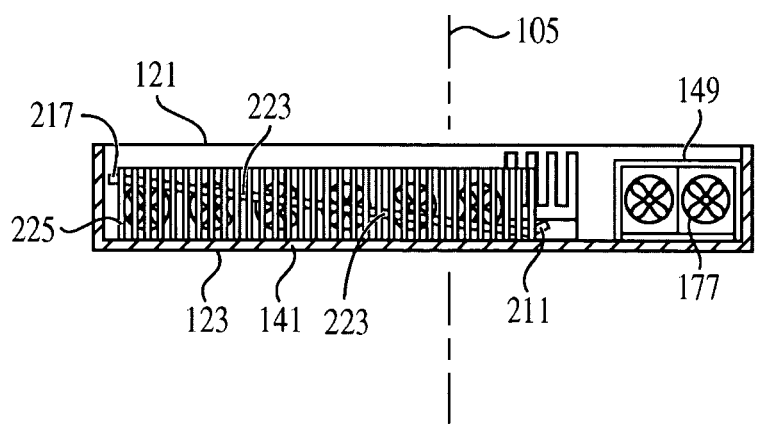
FIG. 4 is a front, cross sectional view of the removed chassis depicted in FIG. 1, taken along line 4—4 of FIG. 3.
Figure 5:
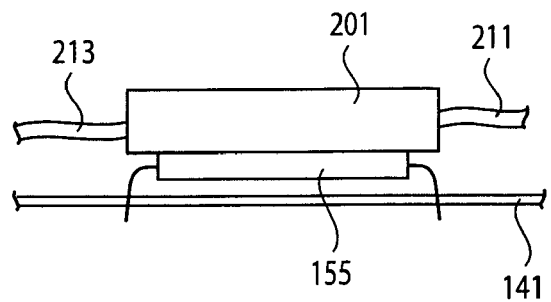
FIG. 5 is a front view of a CPU and an evaporator contained in the removed chassis depicted in FIG. 1.
Figure 6:
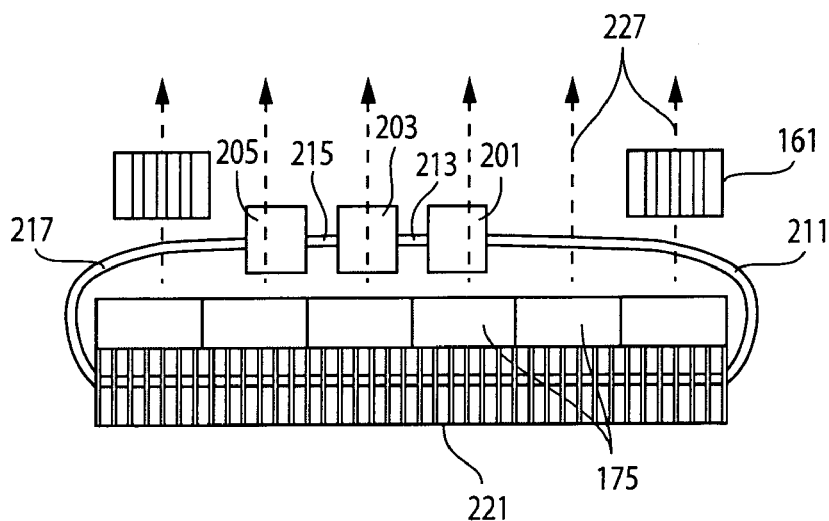
FIG. 6 is a top view of a cooling system contained in the removed chassis depicted in FIG. 1.

With reference to FIGS. 4–6, the chassis cooling system includes a first evaporator 201, a second evaporator 203 and a third evaporator 205. The evaporators may be any of a variety of types, such as evaporators configured for spray cooling or for pool boiling, and could be a thermal sprayer of the type described in U.S. Pat. Nos. 6,205,799, and 6,550,263, which are incorporated herein by reference.

The first and third evaporators, 201 and 205, are each affixed to one of the CPUs 155, and the second evaporator 203 is affixed to the other high-dissipation component 157, thus all three evaporators are affixed to components having high heat dissipation requirements. The evaporators are affixed in a manner placing them in thermal communication with their respective components so that they can dissipate heat from the components. The evaporators, and more generally the cooling system, are configured such heat from each component evaporates liquid coolant from a stream of liquid coolant within its respective evaporator to produce a stream of coolant vapor.

The stream of liquid coolant is received into the first evaporator 201 via a first tube 211. Heat from the first evaporator's respective CPU 155 evaporates part of the stream of liquid coolant to form a stream of coolant vapor. The remaining stream of liquid coolant from the first evaporator and the stream of coolant vapor from the first evaporator are intermingled streams, and pass through a second tube 213 to be received in the second evaporator 203.

Heat from the other high-dissipation component 157 evaporates part of the remaining stream of liquid coolant received from the second tube 213 to form a stream of coolant vapor that intermixes and combines with the stream of coolant vapor evaporated in the first evaporator. The remaining stream of liquid coolant from the second evaporator and the combined streams of coolant vapor from the first and second evaporators pass intermingled through a third tube 215 to be received in the third-evaporator 205.

Heat from the third evaporator's respective CPU 155 evaporates some or all of the remaining stream of liquid coolant received from the third tube 215 to form a stream of coolant vapor that intermixes and combines with the streams of coolant vapor evaporated in the first two evaporators. The remaining stream of liquid coolant, if any, from the third evaporator and the combined stream of coolant vapor from the first, second and third evaporators continue to be intermingled, and pass through a fourth (and last) tube 217.

The combined stream of coolant vapor, possibly along with the remnants of the stream of liquid coolant remaining after the third evaporator, passes through the fourth tube 217 to be received by a condenser 221. The condenser includes one or more passageways 223 that are thermally connected to a plurality of cooling fins 225. The passageways are configured to dissipate heat from the stream of coolant vapor to the fins, and thereby cause the coolant vapor to condense into liquid coolant. This newly condensed liquid coolant commingles with the remnants (if any) of the prior stream of liquid coolant received from the fourth tube, adding newly condensed liquid coolant to form what is effectively the beginning of the stream of liquid coolant. The newly condensed liquid coolant stream exits the condenser through the first tube 211 and passes back toward the first evaporator 201.

The passageways 223 and fins 225 are sized and configured to adequately dissipate the heat from the CPUs 155 and the other high dissipation component 157. The passageways are further configured to define a downward coolant pathway that extends in a gravitationally downhill direction from the fourth tube 217 to the first tube 211. As a result, the newly condensed liquid coolant is pulled downhill by gravity, and forces the coolant stream in the first tube to move toward the first evaporator 201. The forward-moving force of the coolant stream in the first tube is transmitted through to the other tubes, and as a result, the liquid (and vapor) coolant streams are driven through the evaporators. Because the output from the third evaporator 205 is primarily vaporous, the forward-moving force on the liquid can preferably drive the output from the third evaporator uphill with respect to gravity to reach the top of the passageway in the condenser.

As a result, the coolant, the evaporator, the condenser and the connecting tubes form a gravity-driven, pumpless, closed-loop cooling system that extends through each evaporator in series. In optimal operation, the coolant forms a circular stream that is entirely (or mostly) a liquid coolant stream in the first tube, and that is entirely (or mostly) a stream of coolant vapor in the fourth tube.

Figure 7:
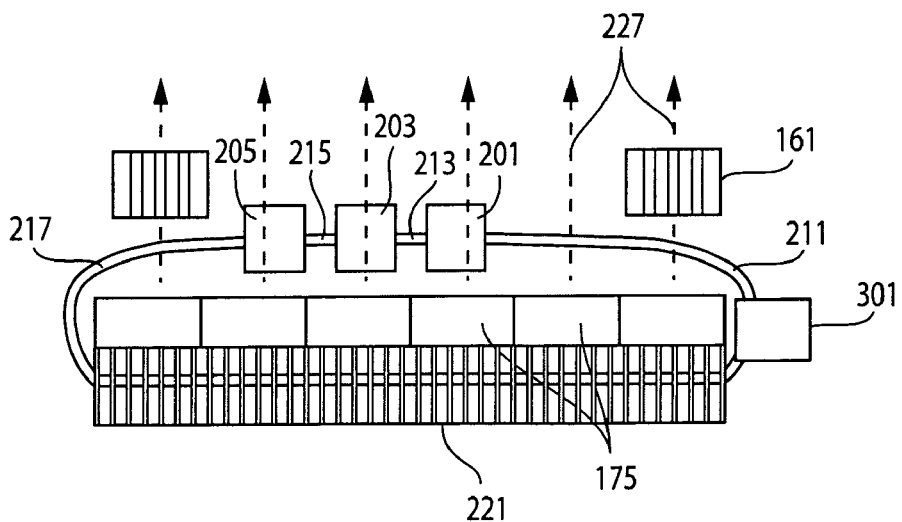
FIG. 7 is a top view of an alternate embodiment of the cooling system contained in the removed chassis depicted in FIG. 1.

With reference to FIG. 7, in two variations of the first embodiment, a small, mechanical coolant pump 301 could be used either to augment the gravity driven system, or to replace it. This coolant pump could be located along the first tube to take advantage of the ease of pumping the coolant stream when it is entirely (or mostly) in a liquid state. In such variations not employing gravitational pumping, the orientation of the chassis with respect to gravity is not critical, and the tier-stacking dimension of the rack could extend laterally.

In another variation, where the tier stacking dimension could be oriented laterally with respect to gravity, and the condenser could be configured to extend across the chassis chamber in a gravitationally vertical direction, thus providing gravitational pumping.

In two further variations of the first embodiment, the mixing of liquid and vapor coolant could be limited or prevented. More particularly, in the first such variation, additional tubes could interconnect the evaporators so as to provide separate liquid and vapor coolant passages between sequential evaporators. In the second such variation, the evaporators could be connected between the first and last tubes in parallel, rather than in series.

Returning to the first embodiment, the cooling fins 225 of the condenser are positioned in the upstream chamber 181, immediately next to an intake side of the bank of chamber fans. The bank of chamber fans thus serves as an air mover configured to draw air through the fins. The air drawn through the fins is heated by the fins, thereby dissipating the fins' heat and cooling the condenser (and the coolant vapor contained inside the condenser passageways 223).

The bank of cooling fans 175 blows across the downstream chamber 183, which contains the memory cards 151, the I/O units 153, the plurality of CPUs 155, the other high-dissipation component 157, and the moderate heat dissipation components 159, as well as any other components that require any significant cooling. Preferably, all cards in the downstream chamber (such as the memory cards), and the fins of all heat sinks 161 in the downstream chamber, are aligned with airstreams 227 (see, FIGS. 2 and 6) blowing from the bank of cooling chamber fans 175 so as to directly receive those airstreams, or at least directly receive airflow caused by those airstreams, without causing an unnecessary impediment. The airstreams and/or airflow can then provide some cooling to cards and components in the downstream chamber.

As a result of the above-described configuration, the high-dissipation components, including the CPUs, are evaporatively cooled, with their heat being dissipated by air drawn from the upstream chamber 181. Most of the components in the downstream chamber 183 are cooled by air from the upstream chamber moving through the downstream chamber, and most are cooled by being directly blown upon with air from the upstream chamber by the bank of cooling fans 175. The power supply 149 is separately cooled using air drawn from the upstream chamber. All components in the upstream chamber are preferably cooled by air drawn by or through the components due to the lower pressure in the upstream chamber.

A second embodiment of the invention is similar to the first in many features. The second embodiment differs, in that, rather than (or supplemental to) drawing in ambient air to cool components, a source of chilled fluid such as air or another gaseous fluid (or conceivably even a liquid fluid for an appropriate application) is in fluid communication with the chassis, preferably via passageways in the rack. The chilled fluid preferably enters the upstream chamber so as to pass through the condenser.

In some additional embodiments of the invention, the air-cooled condenser could be replaced with a condenser of other design. For example, in a third embodiment, the condenser could be cooled with a liquid. The liquid would preferably enter and exit the chassis through tubes and chassis connection ports that connect up to rack connection ports on the modular rack, the chassis and rack ports preferably connecting automatically upon the insertion of the chassis into the rack. The modular rack could be configured with rack ports for chassis located in each chassis-position in the rack. The rack ports are configured with lines forming liquid passageways connecting the various chassis in the rack into a rack liquid loop, either in parallel (typically for efficient cooling) and/or in series (typically to limit cost and space requirements).

The rack liquid loop could include a heat sink that is external to the plurality of chassis, and possibly external to the rack. The heat sink is preferably configured to dissipate heat from all the chassis connecting into the rack liquid loop. The rack liquid loop could be exclusive to the modular rack, or it could encompass a plurality of modular racks interconnected in series and/or in parallel.

A fourth embodiment is similar to the third, except that a closed system is not used. More particularly, the heat sink is replaced with an endless supply of liquid (e.g., a water line) and a liquid exhaust for disposing of heated liquid.

A fifth embodiment is also similar to the third, except that the condenser is cooled with a refrigerant. More particularly, the condenser is configured to be evaporatively cooled by refrigerant that is in turn re-condensed in an external condenser external to the chassis, and possible external to the rack (in the position of the heat sink of embodiment two.

A sixth embodiment of the invention is similar to the fifth, except that the chassis condenser is eliminated. Instead, the coolant lines directly connect the chassis evaporators to chassis ports, which place the evaporators in fluid communication with an external condenser that is external to the chassis, and possibly external to the rack.

The fourth through sixth embodiments, like the third embodiment, can be configured for multiple racks to be interconnected within a single cooling system.

While the depicted enclosure of the first embodiment appeared as a unitary rack with laterally inserted chassis, it is to be understood that other configurations, such as modular structures that can be modularly disassembled, are within the scope of the invention. For example, each chassis could be configured as a stackable module with connectors that provide electrical and electronic connections for other chassis in the stack, allowing for a structure of configurable longitudinal height.

While providing good heat-removal characteristics, the apparatus is preferably configured with features known for typical rackmount enclosures, providing shock, vibration and/or dust protection. For example, the external openings (e.g., the vents) are preferably well shielded from the components, providing good shielding against electromagnetic radiation.

It is to be understood that the invention comprises apparatus and related methods for designing and for producing cooling enclosures, as well as the apparatus and cooling methods of the enclosures themselves. Additionally, various embodiments of the invention can incorporate various combinations of the above described embodiment features (e.g., a mechanical coolant pump could be used in a cooling system where the evaporators are connected in parallel). In short, the above disclosed features can be combined in a wide variety of configurations within the anticipated scope of the invention.

While particular forms of the invention have been illustrated and described, it will be apparent that various modifications can be made without departing from the spirit and scope of the invention. For example, while typical electronic computer components have been described, the cooling of other components such as optical devices and the like are within the scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A modular computer system for mounting in a multi-tiered support, comprising:
    a computer chassis configured for mounting in the multi-tiered support;
    a first computer component within the computer chassis;
    an evaporator in thermal communication with the first computer component, the evaporator being configured to dissipate heat from the first computer component by using that heat to drive a stream of liquid coolant through a phase change into a stream of coolant vapor;
    a condenser configured to dissipate heat from the stream of coolant vapor to add liquid coolant to the stream of liquid coolant;
    an air mover configured to cool the condenser; and
    one or more additional computer components within the computer chassis, wherein the air mover causes airflow that directly cools the one or more additional components;
    wherein the air mover draws air through the condenser, and blows air toward the one or more additional computer components.

2. The apparatus of claim 1, wherein the chassis is a 1U rackmount chassis.

3. The apparatus of claim 1, wherein the evaporator and the condenser are configured as a gravity-driven, pumpless, closed-loop cooling system.

4. The apparatus of claim 1, wherein the evaporator and the condenser are part of a closed-loop cooling system, and further comprising a coolant pump configured to pump coolant through the closed-loop cooling system.

5. The apparatus of claim 1, wherein the condenser defines a downward coolant pathway configured for the coolant to travel gravitationally downward while condensing from the stream of coolant vapor to the stream of liquid coolant.

6. The apparatus of claim 1, and further comprising:
    a second computer component within the chassis; and
    a second evaporator in thermal communication with the second computer component, the second evaporator being configured to dissipate heat from the second computer component by evaporating liquid coolant from a stream of liquid coolant to produce a second stream of coolant vapor;
    wherein the condenser is configured to dissipate heat from the second stream of coolant vapor to add liquid coolant to the stream of liquid coolant.

7. The apparatus of claim 6, wherein:
    the stream of liquid coolant and the first stream of coolant vapor both extend from the first evaporator to the second evaporator through a common passage; and
    the first and second streams of coolant vapor intermix and extend from the second evaporator to the condenser through a common passage.

8. The apparatus of claim 1, wherein the air mover is further configured to move air heated by the condenser out one or more exhaust vents in the chassis.

9. The apparatus of claim 8, wherein:
    the air mover is a plurality of fans extending across an intermediate portion of the chassis to define two chambers, the fans being configured to move air from a first chamber of the two chambers to a second chamber of the two chambers; and
    the chassis exhaust vents ventilate the second chamber.

10. The apparatus of claim 1, wherein the air mover blows directly toward the one or more additional computer components.

11. A modular computer system for mounting in a multi-tiered support, comprising:
   a computer chassis configured for mounting in the multi-tiered support;
   a first computer component within the computer chassis;
   a means for evaporating liquid coolant from a stream of liquid coolant, using heat from the first computer component, to produce a stream of coolant vapor;
   a means for removing heat from the stream of coolant vapor;
   a means for transferring the removed heat out of the chassis; and
   one or more additional computer components within the computer chassis, wherein the means for transferring causes airflow that directly cools the one or more additional components;
   wherein the means for transferring draws air through the condenser, and blows air toward the one or more additional computer components.

12. A method for cooling a first computer component, comprising:
   mounting a computer chassis of a modular computer system in a multi-tiered support, the first computer component being located within the computer chassis;
   evaporating liquid coolant from a stream of liquid coolant, using heat from the first computer component, to produce a stream of coolant vapor;
   removing heat from the stream of coolant vapor, in a condenser, to form the stream of liquid coolant; and
   transferring the removed heat out of the chassis by absorbing the heat in a stream of air drawn through the condenser, wherein the stream of air is blown toward the one or more additional computer components to directly cool the one or more additional computer components.

13. The method of claim 12, wherein the chassis is a 1U rackmount chassis.

14. The method of claim 12, wherein the chassis is a thin rackmount chassis.

15. The method of claim 12, wherein the step of removing is conducted in a downward coolant pathway configured for the coolant to travel gravitationally downward while condensing from the stream of coolant vapor to the stream of liquid coolant.

16. A modular computer system for mounting in a multi-tiered support, comprising:
   a computer chassis configured for mounting in the multi-tiered support;
   a computer component within the computer chassis;
   an evaporator in thermal communication with the computer component, the evaporator being configured to dissipate heat from the computer component by using that heat to drive a stream of liquid coolant through a phase change into a stream of coolant vapor;
   a condenser configured to dissipate heat from the stream of coolant vapor to add liquid coolant to the stream of liquid coolant; and
   an airflow control structure extending substantially across an intermediate portion of the chassis to define two chambers, the airflow control structure including an air mover configured to move air from a first chamber of the two chambers to a second chamber of the two chambers;
   wherein the air mover directs airflow both to cool one or more additional components, and to cool the condenser;
   wherein the chassis includes an intake vent that ventilates the first chamber such that the air mover is configured to draw air into the first chamber through the intake vent; and
   wherein the chassis includes an exhaust vent that ventilates the second chamber such that the air mover is configured to move air heated by the condenser from the second chamber through the exhaust vent.

17. The modular computer system of claim 16, wherein the air mover is a plurality of fans extending substantially across an intermediate portion of the chassis.

18. A modular computer system for mounting in a multi-tiered support, comprising:
   a computer chassis configured for mounting in the multi-tiered support;
   a first computer component, which requires cooling, within the computer chassis;
   one or more additional computer components, which require cooling, within the computer chassis;
   a body within the chassis, the body defining a plurality of cooling fins and a fluid passageway in thermal communication with the cooling fins, the fluid passageway being configured to place fluid in thermal communication with the first computer component to dissipate heat from the first computer component via the fins; and
   an air mover configured to cool the plurality of cooling fins, wherein the air mover forces air through the cooling fins, and wherein the air mover forces the resulting airflow into thermal communication with the one or more additional computer components.

19. A modular computer system for mounting in a multi-tiered support, comprising:
   a computer chassis configured for mounting in the multi-tiered support;
   a first computer component within the computer chassis;
   one or more additional computer components within the computer chassis;
   an evaporator in thermal communication with the first computer component, the evaporator being configured to dissipate heat from the first computer component by evaporating liquid coolant from a stream of liquid coolant to produce a stream of coolant vapor;
   a condenser configured to be cooled by dissipating heat from the stream of coolant vapor into an airstream, and thereby to add liquid coolant to the stream of liquid coolant;
   an air mover configured to create the airstream that cools the condenser, wherein the air mover forces the airstream into thermal communication with the one or more additional computer components.

20. The modular computer system of claim 19, wherein:
   the air mover is a plurality of fans extending substantially across an intermediate portion of the chassis to define two chambers, the plurality of fans being configured to move air from a first chamber of the two chambers to a second chamber of the two chambers;
   the chassis includes an intake vent that ventilates the first chamber such that the air mover is configured to draw air into the first chamber through the intake vent; and
   the chassis includes an exhaust vent that ventilates the second chamber such that the air mover is configured to move air heated by the condenser from the second chamber through the exhaust vent.

* * * * *